United States Patent
Veeramma

(10) Patent No.: US 9,935,206 B2
(45) Date of Patent: Apr. 3, 2018

(54) PACKAGED OVERVOLTAGE PROTECTION CIRCUIT FOR TRIGGERING THYRISTORS

(71) Applicant: IXYS Corporation, Milpitas, CA (US)

(72) Inventor: Subhas Chandra Bose Jayappa Veeramma, Lampertheim (DE)

(73) Assignee: IXYS Corporation, Milpitas, CA (US)

( * ) Notice: Subject to any disclaimer, the term of this patent is extended or adjusted under 35 U.S.C. 154(b) by 626 days.

(21) Appl. No.: 13/892,237

(22) Filed: May 10, 2013

(65) Prior Publication Data

US 2014/0332842 A1 Nov. 13, 2014

(51) Int. Cl.
| | |
|---|---|
| *H01L 29/66* | (2006.01) |
| *H01L 29/87* | (2006.01) |
| *H01L 23/62* | (2006.01) |
| *H01L 25/07* | (2006.01) |
| *H01L 29/06* | (2006.01) |

(52) U.S. Cl.
CPC ............ *H01L 29/87* (2013.01); *H01L 23/62* (2013.01); *H01L 25/072* (2013.01); *H01L 29/0619* (2013.01); *H01L 29/0638* (2013.01); *H01L 2224/06181* (2013.01); *H01L 2924/1301* (2013.01); *H01L 2924/1305* (2013.01)

(58) Field of Classification Search
USPC ......................................... 257/119, 109, 111
See application file for complete search history.

(56) References Cited

U.S. PATENT DOCUMENTS

| | | | | |
|---|---|---|---|---|
| 3,231,796 A | * | 1/1966 | Shombert | ............... H01L 21/00 257/112 |
| 3,938,026 A | * | 2/1976 | Hoffmann et al. | ............. 363/68 |
| 4,117,505 A | * | 9/1978 | Nakata | .......................... 257/108 |
| 4,367,418 A | * | 1/1983 | Faust | ..................... H03K 17/16 327/422 |
| 4,473,858 A | * | 9/1984 | Thiele | .......................... 361/91.8 |

(Continued)

OTHER PUBLICATIONS

K. G. McKay "Avalanche Breakdown in Silicon" Phys. Rev. 94, 877—Published May 15, 1954.*

(Continued)

*Primary Examiner* — Sitaramarao S Yechuri
(74) *Attorney, Agent, or Firm* — Imperium Patent Works; T. Lester Wallace; Amir V. Adibi

(57) ABSTRACT

In a first embodiment, an ultra-fast breakover diode has a turn on time $T_{ON}$ that is less than 0.3 microseconds, where the forward breakover voltage is greater than +400 volts and varies less than one percent per ten degrees Celsius change. In a second embodiment, a breakover diode has a reverse breakdown voltage that is greater, in absolute magnitude, than the forward breakover voltage, where the forward breakover voltage is greater than +400 volts. In a third embodiment, a string of series-connected breakover diode dice is provided, along with a resistor string, in a packaged circuit. The packaged circuit acts like a single breakover diode having a large forward breakover voltage and a comparably large reverse breakdown voltage, even though the packaged circuit includes no discrete high voltage reverse breakdown diode. The packaged circuit is usable to supply a triggering current to a thyristor in a voltage protection circuit.

22 Claims, 16 Drawing Sheets

BREAKOVER DIODE DEVICE

(56) References Cited

U.S. PATENT DOCUMENTS

| | | | | |
|---|---|---|---|---|
| 4,651,251 | A | * | 3/1987 | Thiele ................ H03K 17/0824 |
| | | | | 327/465 |
| 4,967,256 | A | * | 10/1990 | Pathak et al. ................. 257/112 |
| 5,359,211 | A | * | 10/1994 | Croft ............................. 257/173 |
| 5,710,463 | A | * | 1/1998 | Vogel .................... C09J 179/08 |
| | | | | 257/113 |
| 5,828,089 | A | * | 10/1998 | Bernier ......................... 257/173 |
| 5,880,488 | A | * | 3/1999 | Yu ................................. 257/111 |
| 2002/0003447 | A1 | * | 1/2002 | Nagase et al. ................ 327/530 |
| 2004/0135170 | A1 | * | 7/2004 | Menard ......................... 257/119 |
| 2010/0259857 | A1 | * | 10/2010 | Mayerhofer et al. ........... 361/56 |

OTHER PUBLICATIONS

Godse et al. "Electronics & Microprocessors", ISBN 9788184317626, Technical Publications Pune, 2010, pp. 1-58 to 1-64.*

* cited by examiner

THYRISTOR SYMBOL

P-N-P-N THYRISTOR
STRUCTURE

SELF-LATCHING BIPOLAR TRANSISTOR
STRUCTURE OF THE THYRISTOR

BULK BOD

ELECTRIC FIELD ALONG LINE A-A'

SWITCHING

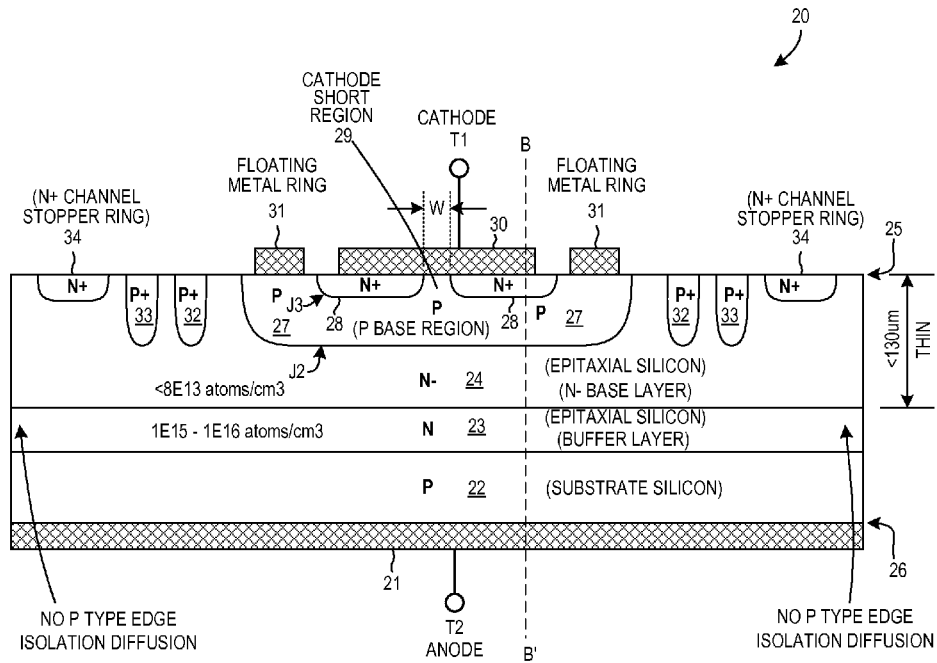
BREAKOVER DIODE DEVICE
FIG. 7
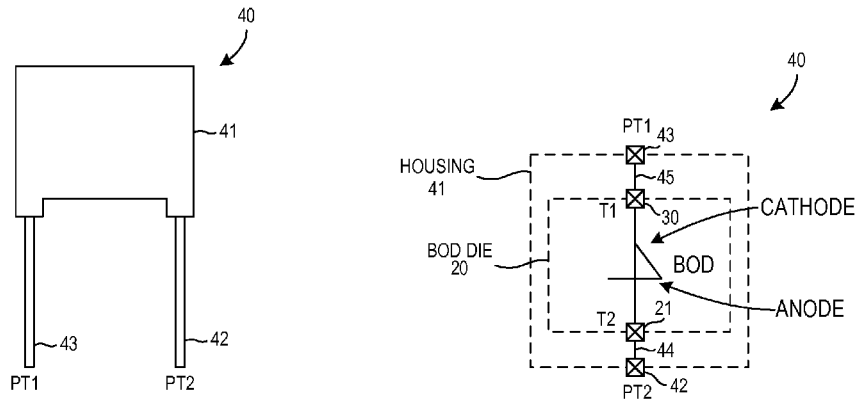
PACKAGED BOD
DEVICE
FIG. 8
PACKAGED BOD
DEVICE
FIG. 9

VIEW OF TOP OF THE BOD DIE

VIEW OF BOTTOM OF THE BOD DIE

TEST CIRCUIT FOR SWITCHING THE BOD

SWITCHING DIAGRAM OF THE BOD

ELECTRIC FIELD ALONG LINE B-B'

DEPLETION REGION JUST BEFORE
AVALANCHE BREAKDOWN

ONE WAFER YIELDS BOD DEVICES WITH
DIFFERENT TRIGGERING CURRENTS

CHANGE IN BREAKOVER VOLTAGE AS A
FUNCTION OF TEMPERATURE

V-I CHARACTERISTICS OF THE BOD DEVICE

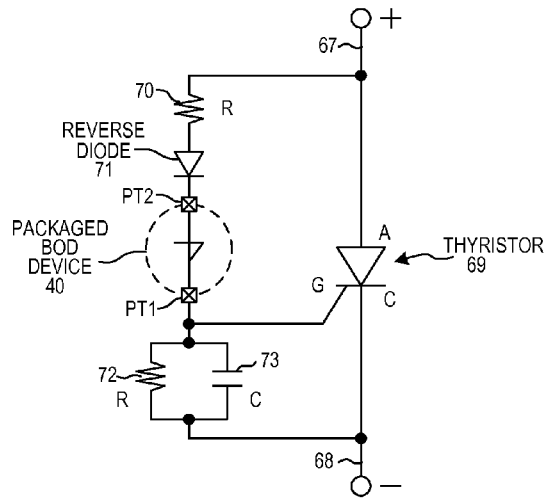

THYRISTOR PROTECTION
CIRCUIT

FIG. 19

| NAME OF REGION OR STRUCTURE | REFERENCE NUMBER | COMPOSITION AND DIMENSIONS |
|---|---|---|
| N- BASE LAYER (EPI) | (24) | 20-130um     <8E13 atoms/cm3 (200V - 1400V) |
| N TYPE BUFFER LAYER (EPI) | (23) | 15-25um     1E15 - 1E16 atoms/cm3 |
| P TYPE SUBSTRATE | (22) | 1E18 - 8E18 atoms/cm3 |
| P BASE REGION | (27) | 5-15um DEEP (1E14 - 1E15 cm-2) IMPLANT BORON<br>Min. Radius = 2x to 4x the thickness of the N- BASE LAYER |
| N+ REGION | (28) | 2-5um DEEP, 5E18 - 5E19 atoms/cm3 |
| CATHODE SHORT REGION | (29) | 0.02mm WIDE - 0.50mm WIDE |
| P+ GUARD RING | (32) | 10um OPENING, 10um DEEP |
| P+ GUARD RING | (33) | 10um OPENING, 10um DEEP |
| N+ CHANNEL STOPPER RING | (34) | 5E18 - 5E19 atoms/cm3 |
| CATHODE ELECTRODE | (30) | AlTiNiAg |
| FLOATING METAL RING | (31) | 50-150um ALUMINUM (FLOATING) |
| ANODE ELECTRODE | (21) | AlTiNiAg |

COMPOSITION OF THE EPI BOD DEVICE
OF FIG. 7

FIG. 20

| CATHODE SHORT REGION WIDTH | TRIGGERING CURRENT (SMALLER TRIGGERING CURRENT RESULTS IN FASTER TRIGGERING) | TURN ON TIME ($T_{ON}$) | FORWARD BREAKOVER VOLTAGE (AT 25°C) | PERCENT CHANGE IN FORWARD BREAKOVER VOLTAGE PER TEN DEGREES CELSIUS |
|---|---|---|---|---|
| 0.020mm | 10uA | 0.3usec | 8000V | <1%/10°C |
| 0.025mm | 1mA | 0.3usec | 8000V | <1%/10°C |
| 0.125mm | 5mA | 0.3usec | 8000V | <1%/10°C |
| 0.250mm | 10mA | 0.3usec | 8000V | <1%/10°C |
| 0.375mm | 15mA | 0.3usec | 8000V | <1%/10°C |
| 0.500mm | 20mA | 0.3usec | 8000V | <1%/10°C |

BOD DEVICES FABRICATED ON SAME WAFER WITH
DIFFERENT TRIGGERING CURRENTS

FIG. 21

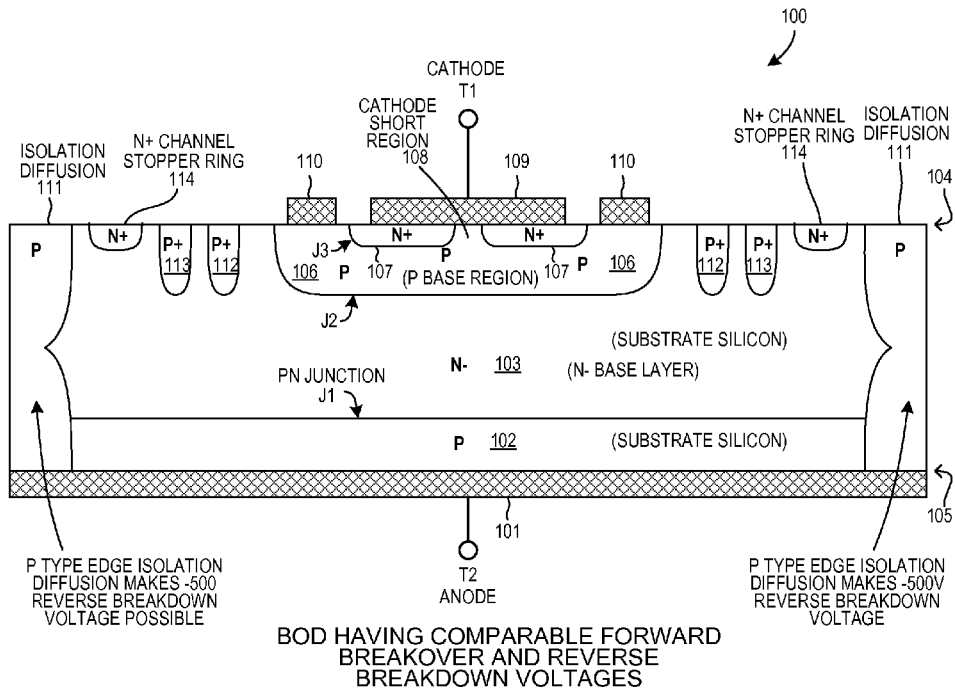
FIG. 22
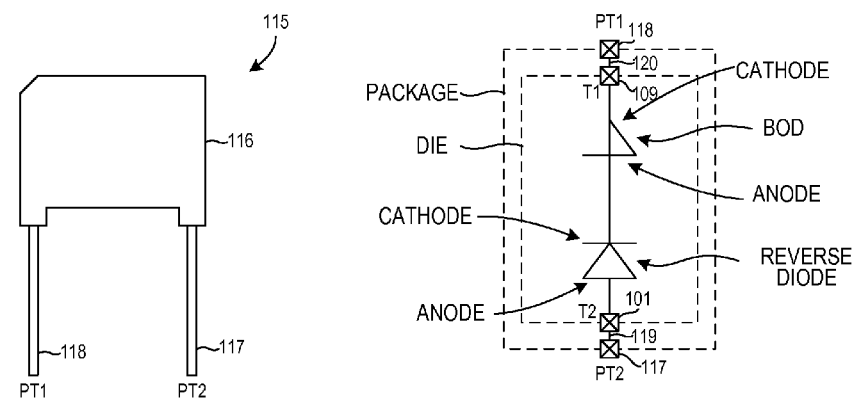
PACKAGED BOD OF
FIG. 22
FIG. 23
SYMBOL OF PACKAGED
BOD OF FIG. 22
FIG. 24

VIEW OF TOP OF THE BOD OF FIG. 22

VIEW OF BOTTOM OF THE BOD OF FIG. 22

SWITCHING DIAGRAM OF THE BOD OF FIG. 22

V-I CHARACTERISTICS OF BOD OF FIG. 22

| NAME OF REGION OR STRUCTURE | REFERENCE NUMBER | COMPOSITION AND DIMENSIONS |
|---|---|---|
| N- BASE LAYER (SUBSTRATE SILICON) | (103) | 160-200um |
| P TYPE SUBSTRATE | (102) | 35-45um DEEP |
| P BASE REGION | (106) | 35-45um DEEP |
| ANNULAR N+ REGION | (107) | 20-30um DEEP, 5E18 - 5E19 atoms/cm3 |
| CATHODE SHORT REGION | (108) | 0.15 - 0.30mm |
| P+ GUARD RING | (112) | 37um OPENING, 35-45um DEEP |
| P+ GUARD RING | (113) | 37um OPENING, 35-45um DEEP |
| N+ CHANNEL STOPPER RING | (114) | 5E18 - 5E19 atoms/cm3 |
| CATHODE ELECTRODE | (109) | AlTiNiAg |
| FLOATING METAL RING | (110) | 50-150um ALUMINUM (FLOATING)(OPTIONAL) |
| ANODE ELECTRODE | (101) | AlTiNiAg |
| P TYPE EDGE ISOLATION | (111) | 200um OPENING, 150-175um DEEP |

COMPOSITION OF BOD OF FIG. 22

FIG. 31

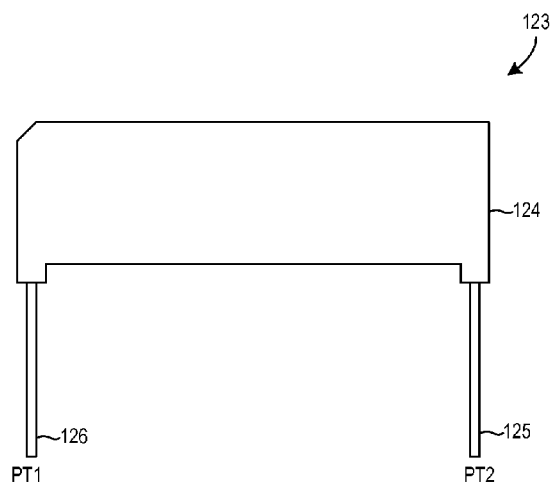

PACKAGED OVERVOLTAGE
PROTECTION CIRCUIT

FIG. 32

PACKAGED OVERVOLTAGE PROTECTION CIRCUIT FOR TRIGGERING THYRISTORS

TECHNICAL FIELD

The described embodiments relate to breakover diodes and to related structures and methods.

BACKGROUND INFORMATION

FIG. 1 (Prior Art) is a symbol of a thyristor 1. A conventional thyristor is a three terminal semiconductor device that has four layers of alternating N type material and P type material. FIG. 2 (Prior Art) shows an example in which the thyristor device 1 has an P-N-P-N structure. A cathode electrode 2 is coupled to the N type material on one side of the device and an anode electrode 3 is coupled to the P type material on the other side of the device. A gate electrode 4 is coupled to the P type layer closest to the cathode. The structure has three PN junctions, serially named J1, J2, and J3, from the anode electrode side of the device. Operation of the thyristor device is explained in terms of a pair of tightly coupled bipolar junction transistors, arranged in a self-latching way, as illustrated in FIG. 3 (Prior Art). One bipolar transistor 5 is an NPN transistor whose N type emitter is coupled to the cathode electrode. The other bipolar transistor 6 is a PNP transistor whose P type emitter is coupled to the anode electrode. The thyristor is considered to operate in one of three modes: 1) in a reverse blocking mode, 2) in a forward blocking mode, and 3) in a forward conducting mode.

If the cathode electrode has a positive voltage with respect to the anode electrode, then no current flows from cathode to anode because either the J3 junction and/or the J1 junction is reverse biased. These two PN junctions can be thought of as a series connected pair of diodes that are reverse biased. This is referred to as the reverse blocking mode. Supplying a triggering pulse into the gate has no effect.

If the anode has a positive voltage with respect to the cathode, but no voltage is applied to the gate electrode with respect to the cathode electrode, then the J1 and J3 junctions are forward biased, while the J2 junction is reverse biased. Due to the J2 junction being reverse biased, there is no conduction and the thyristor is off. This is referred to as the forward blocking mode. The anode-to-cathode voltage is applied in a direction that could cause conduction were there to be current flow across the J2 junction, but the thyristor has not been triggered. At some voltage, the electric field at the J2 junction grows so strong that the J2 junction starts to breakdown and a small amount of avalanche current begins to flow, but the amount of current is not adequate to turn on transistor 5.

If the anode-to-cathode voltage is increased beyond the forward breakdown voltage $V_{(BO)F}$ of the thyristor, then the magnitude of the avalanche current reaches a triggering current, which causes transistor 5 to turn on, and causes the thyristor to start conducting. This is referred to as the forward conduction mode.

If a positive voltage is applied to the gate electrode with respect to the cathode electrode, then the onset of this avalanche breakdown of the J2 junction occurs at a lower (but still positive) anode-to-cathode voltage. The anode-to-cathode voltage at which the thyristor turns on is therefore dependent upon the gate voltage (gate-to-cathode voltage). This positive gate voltage that causes the thyristor to turn on (due to avalanche breakdown of the J2 junction) can be caused by injecting a momentary current pulse 7 into the gate electrode 4. Whether the triggering on is said to occur due to the gate voltage pulse or due to the current of the pulse, the triggering effect of triggering the thyristor on is the same in that avalanche breakdown of the J2 junction is started.

Once avalanche breakdown of the J2 junction has occurred and the thyristor is on and conducting current from the anode to the cathode, the thyristor remains latched in this on state and the thyristor continues to conduct, irrespective of changes in the gate voltage, until either the anode is no longer forward biased with respect to the cathode, or until the current through the thyristor (anode to cathode) is less than a holding current $I_H$. Once the thyristor has been triggered, removing the triggering current does not turn off the thyristor. If the anode is positively biased with respect to the cathode, then the thyristor cannot be turned off unless the anode current falls below the holding current $I_H$. The thyristor can, however, be switched off if an external circuit momentarily causes the anode to be negatively biased with respect to the cathode.

Very large and expensive thyristors are used to switch high voltages in high power applications. Due to the limited maximum forward voltage drop (anode to cathode) that can be put across a thyristor before it conducts too much current and fails, many thyristors are typically assembled together in series in what is referred to as a stack. Each thyristor of the stack therefore only has to handle part of the overall high forward voltage drop across the stack. By controlling the gate voltages of the individual thyristors in the stack, the stack can be made to operate as a single high voltage and high power switch that either conducts from one end of the stack to the other, or that does not conduct. Thyristor stacks are, for example, used in megawatt scale AC-to-DC and DC-to-AC power conversion, such as for example where the high DC voltage is a voltage on a high voltage DC power transmission line. If the magnitude of the high voltage DC were to momentarily pulse high, such as due to the power line being struck by lightning, then an intolerably high transient voltage might be momentarily placed across the thyristor stack (the anode voltage is at too high a positive voltage with respect to the cathode), causing excessive current flow through the stack if the thyristors were on, and causing localized overheating and failure of the stack. To avoid this, and to protect the thyristors of the stack from such a transient overvoltage condition, an overvoltage protection device referred to as a BOD (Break Over Diode) device is used. BOD devices are coupled to the thyristors of the stack in such a way that the BOD devices turns on the thyristors before excessive over voltage across the thyristors can damage the thyristors. The BOD overvoltage protection device detects the high voltage condition and turns on, thereby causing a gate current to flow into the gate of each thyristor, and thereby turning on the thyristor.

A BOD diode is a thyristor whose gate electrode is not brought out of the device for external connection. The BOD diode has an anode electrode and a cathode electrode, but the gate electrode of the device is not brought out. The BOD diode is not triggered on by an externally applied pulse of gate current as described above in the case of a conventional thyristor, but rather the BOD diode is triggered on by the onset of avalanche current that is generated within the BOD device itself. Operation of the BOD diode is therefore explained using the terminology employed above in connection with the self-latching bipolar transistor structure of FIG. 3. In a forward blocking mode, as the anode-to-cathode voltage increases to the $V_{(BO)F}$, the J1 and J3 junctions are forward biased but the J2 junction is reversed biased. A depletion region forms at this reverse biased J2 junction, and the resulting separation of charge at the junction gives rise to a localized electric field. The strength of the electric field grows to the point that covalent bonds of the material at the J2 junction are broken, and an avalanche current flows, with generated electrons being pulled to the relative positive potential of the anode, and with generated holes being pulled the opposite direction to the relative negative potential of the cathode. The hole flow through the P type layer between J2 and J3 results in a voltage drop across the material of the P type layer. If the avalanche current is of adequate magnitude, then the voltage drop exceeds 0.7 volts, resulting in the base-to-emitter voltage of the NPN transistor 5 (see FIG. 3) exceeding 0.7 volts. This causes the NPN transistor 5 to turn on. The NPN transistor 5 turning on pulls a base current out of the base of the PNP transistor 6. PNP transistor 6 turns on, and supplies current from its collector into the base of the NPN transistor 5. The two transistors are therefore latched on in a self-latching way, with each one supplying a base current to the other. Once the BOD diode has triggered itself on in this way, it will remain on unless either the anode is no longer forward biased with respect to the cathode, or until the current through the BOD diode falls below the holding current $I_H$.

In an overvoltage protection application, the BOD diode is coupled in parallel with a power thyristor of a stack, such that if an excessive forward voltage develops across the power thyristor, then the BOD diode undergoes breakover and turns on, thereby conducting a current. This current is supplied as a triggering pulse to the thyristor, so that the thyristor is turned on. Accordingly, when the forward voltage across the thyristor reaches an adequately high voltage, the breakover diode supplies a triggering current to the thyristor and causes the thyristor to turn on. When the thyristor turns on, the forward voltage drop across the thyristor decreases. The thyristor is therefore protected from an over voltage condition.

FIG. 4 (Prior Art) is a cross-sectional diagram of a conventional bulk BOD diode 8. The PNPN thyristor structure is evident. Whereas the anode electrode 3 of the PNPN structure of FIG. 2 is illustrated on the top, the anode electrode 9 of the BOD diode of FIG. 4 is illustrated on the bottom. The P type substrate layer 10 is the first P type thyristor layer, the N− type substrate layer 11 is the second N type thyristor layer, the P type base region 12 is the third P type thyristor layer, and the N+ type region 13 is the fourth N type thyristor layer. Layers 10 and 11 are both of substrate silicon, so the BOD is referred to here as a "bulk" BOD. Reference numeral 14 identifies the cathode electrode. The BOD device has guard rings 15 and 16, and a peripheral shallow channel stopper 17.

FIG. 5 (Prior Art) is a diagram that shows the electric field along line A-A' in FIG. 4 just before the onset of avalanche breakdown. The peak of the electric field is at the J2 PN junction. The J2 PN junction is between the N− type base layer 11 and the P type base region 12. When the electric field strength at this point is high enough, then the avalanche current begins to flow. If the magnitude of current flow from the junction laterally under the emitter region 13 across the resistance of the P type material of region 12 and to the cathode electrode 14 is adequately high, then the resulting voltage drop will reach 0.7 volts. This 0.7 volt drop amounts to a 0.7 base-to-emitter voltage on the NPN transistor, so the thyristor will be triggered on as described above.

FIG. 6 (Prior Art) is a diagram that shows the turning on of the BOD device 8 of FIG. 4. The BOD device has 8 has a reverse breakdown voltage of −200 volts to −300 volts. In the forward voltage condition, the solid line 18 in FIG. 6 represents current flow through the BOD device from anode to cathode. The dashed line 19 is the anode-to-cathode voltage across the BOD device. As can be seen, the BOD device begins to conduct appreciable current at a forward anode-to-cathode breakover voltage $V_{(BO)F}$ of about +450 volts. This is the time when the avalanche current in the BOD device has reached the triggering current. Thereafter the current increases and the voltage across the BOD device decreases. At time 0.6 microseconds the anode-to-cathode voltage across the BOD device has decreased to zero volts. The turn on time $(T_{ON})$ is the time from the time when the internal triggering current is reached at time 0.1 microseconds until the time when the anode-to-cathode voltage reaches zero volts. The turn on time $(T_{ON})$ is therefore 0.5 microseconds. Because a high transient overvoltage condition can cause a power thyristor of a stack to be destroyed in a short amount of time, a fast turn on BOD is desired for its thyristor-protection function.

SUMMARY

In a first novel aspect, an ultra-fast breakover diode has a turn on time $T_{ON}$ of less than 0.3 microseconds, a breakover voltage greater than +400 volts, and the breakover voltage varies less than one percent per ten degree Celsius change. The breakover voltage is also repeatable over changes in semiconductor manufacturing process. In one example, an anode metal electrode is disposed on a bottom surface of a P type layer of substrate semiconductor material, and an N type buffer layer of epitaxial semiconductor material is disposed on the P type layer. The N type buffer layer has an N type dopant concentration between $1 \times 10^{15}$ atoms/cm$^3$ and $1 \times 10^{16}$ atoms/cm$^3$. A thin layer of N− type base layer of epitaxial semiconductor material is disposed on the N type buffer layer. This thin layer is less than 130 microns thick. A P type base region extends from a semiconductor surface down into the thin N− type base layer to a depth D. The P type base region has a peripheral edge at the semiconductor surface, and the peripheral edge has a minimum radius of curvature R that is at least twice the depth D. An N+ type annular emitter region extends down from the semiconductor surface down into the P type base region such that material of the P type base region extends up to the semiconductor surface in the center of the N+ annular region and defines a cathode short region of P type semiconductor material. The cathode short region has a width at the semiconductor surface that is less than 0.250 millimeters. A cathode metal electrode is disposed over part of the annular N+ type emitter and over the cathode short region at the semiconductor surface. A floating metal ring is disposed on the P type base region.

In a second novel aspect, a high voltage breakover diode has comparable forward breakover and reverse breakdown voltages. In one example, an anode metal electrode is disposed on a bottom semiconductor surface of a P type layer of substrate semiconductor material. An N− type base layer is disposed on the P type layer, and a P type base region extends from an upper semiconductor surface down into the N− type base layer. An N+ type annular emitter region extends down from the upper semiconductor surface into the P type base region. P type material of the P type base region extends up to the semiconductor surface in the center of the annular emitter region and defines a cathode short region. A P type isolation diffusion region extends from the upper semiconductor surface to the bottom semiconductor surface, and the P type isolation diffusion region surrounds the N− type base layer in the lateral dimension so that the P type isolation diffusion contacts each of four side edges of the die of breakover diode device. A cathode metal electrode is disposed over part of the annular N+ type emitter and over the cathode short region at the upper semiconductor surface. The breakover diode device has a forward breakover voltage ($V_{(BO)F}$) that is greater than four hundred volts. The breakover diode device is also able to withstand a reverse voltage whose absolute value is in excess of the forward breakover voltage without suffering breakdown.

In a third novel aspect, a packaged overvoltage protection circuit includes a plurality of identical breakover diode dice, and a plurality of resistors. The plurality of breakover diode dice are coupled together in series between a first package terminal and a second package terminal. The plurality of resistors are coupled together in a resistor string, such that one resistor is in parallel with each of the plurality of breakover diode dice. The plurality of breakover diode dice and the plurality of resistors are enclosed in a package housing from which the first and second package terminals extend. Each of the breakover diodes has a reverse breakdown voltage that is greater in absolute magnitude than the forward breakover voltage of the breakover diode, and the forward breakover voltage is at least 400 volts. Of importance, the packaged overvoltage protection circuit need contain no expensive separate discrete diode with a high reverse breakdown capability. The only semiconductor components of the packaged overvoltage protection circuit are the plurality of breakover diode dice. Accordingly, the package housing encloses no semiconductor die that comprises any component other than a breakover diode.

In one application, the packaged overvoltage protection circuit is usable to supply a triggering current to the gate of a thyristor. If the voltage between the anode and the cathode of the thyristor exceeds a first positive voltage, then the breakover diodes in the packaged overvoltage protection circuit will undergo breakover such that a triggering current is supplied from the packaged overvoltage protection circuit and into the gate of the thyristor. The triggering current turns the thyristor on, and the thyristor conducts a large current to reduce the voltage across the thyristor between the anode and cathode to be less than the first positive voltage. A large negative voltage between the gate of the thyristor and the anode of the thyristor will not damage the packaged overvoltage protection circuit because the packaged overvoltage protection circuit can withstand a reverse voltage of a second voltage. The second voltage is a large negative voltage that has an absolute value that is greater than the first positive voltage. The number of breakover diode dice in series can be increased to increase the first and second voltages. In one example, the first voltage is +8000 volts, and the second voltage is −10,000 volts.

In one example, a snubber circuit is provided between the gate and cathode of the thyristor to soften ill effects of switching voltage spikes on the packaged overvoltage protection circuit. A current limiting resistor is placed in series with the packaged overvoltage protection circuit between the thyristor anode and the thyristor gate to limit the magnitude of the triggering current. A second identical circuit (packaged overvoltage protection circuit, thyristor, current limiting resistor, and snubber circuit) is provided in parallel with the first circuit to protect against large negative voltages that are more negative than −8000 volts.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 7 is a simplified cross-sectional diagram of a breakover diode (BOD) die in accordance with a first novel aspect.

FIG. 8 is a diagram of a package that contains the BOD die of FIG. 7.

FIG. 9 is a schematic diagram of the package of FIG. 8.

FIG. 19 is a diagram of a thyristor protection circuit that involves the BOD die of FIG. 7.

FIG. 20 is a table that sets forth aspects of the composition of various parts of the BOD die of FIG. 7.

FIG. 21 is a table that shows how the turn on time of a device of the architecture of the BOD die of FIG. 7 can be adjusted.

FIG. 22 is a cross-sectional diagram of a BOD device in accordance with a second novel aspect.

FIG. 23 is a diagram of a package that contains the breakover diode device of FIG. 22.

FIG. 24 is a schematic diagram of the package of FIG. 23.

FIG. 31 is a table that sets forth aspects of the composition of various parts of the BOD device of FIG. 22.

FIG. 32 is a diagram of a packaged overvoltage protection circuit in accordance with a third novel aspect.

DETAILED DESCRIPTION

Figure 1:
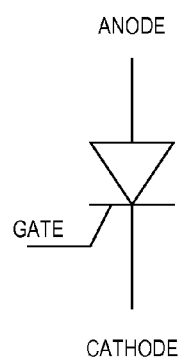
FIG. 1 (Prior Art) is a diagram of a thyristor symbol.
Figure 2:
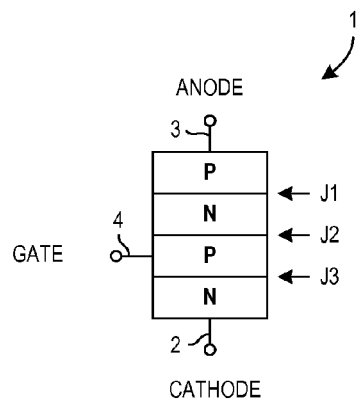
FIG. 2 (Prior Art) is a simplified diagram of the structure of a thyristor.
Figure 3:
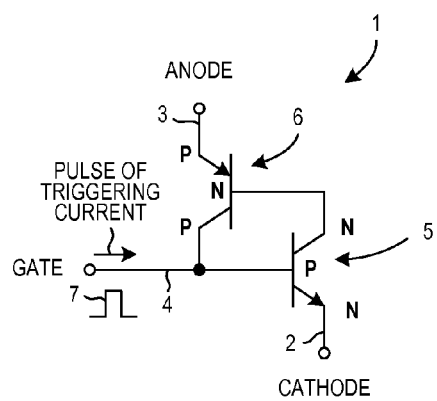
FIG. 3 (Prior Art) is a simplified circuit diagram of a thyristor.

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "down", and "bottom" are used herein to describe relative orientations between different parts of the structure being described, and it is to be understood that the overall structure being described can actually be oriented in any way in three-dimensional space. The notations N+, N−, N, P+, and P are only relative, and are to be considered in context, and do not denote any particular dopant concentration range.

FIG. 7 is a cross-sectional diagram of a breakover diode (BOD) device 20 in accordance with one novel aspect. A metal anode electrode 21 is disposed on the bottom surface of a layer of P type substrate semiconductor material 22. An N type buffer layer 23 of epitaxial semiconductor material is disposed on the P type substrate layer 22. The epitaxial layer is grown on the substrate using known processes. An N− type base layer 24 of epitaxial semiconductor material is disposed on the N type buffer layer 23. The N− type base layer 24 is more lightly doped with N type dopants than is the N type buffer layer 23. The N− type layer 24 extends up to an upper semiconductor surface 25 of the die structure. The bottom semiconductor surface 26 of the die structure is identified by reference numeral 26. In the illustrated example, the two surfaces 25 and 26 are substantially planar. A P type base region 27 extends down into the N− type base layer 24 from the upper semiconductor surface 25. An N+ type annular emitter region 28 extends down into the P type base region 27 from the upper semiconductor surface 25 as shown. The region 28 is annular in that it has a ring-shape when considered from the top-down perspective. An amount of the P type material of the P type base region 27 extends up in the center of this annular structure so that the P type material reaches the upper semiconductor surface 25. This amount of P type material is referred to as the "cathode short region" 29. Cathode short region 29 has a width W at the upper semiconductor surface 25. A metal cathode electrode 30 is disposed on the upper semiconductor surface 25 so that it makes contact with the N+ type annular emitter region 28 and with the cathode short region 29 at the upper semiconductor surface 25 as shown.

A floating metal ring 31 is disposed on the upper surface of the P type base region 27 so that the floating metal ring 31 surrounds, but does not touch, the metal cathode electrode 30. The floating metal ring 31 is "floating" in the sense that it is not electrically coupled to the cathode metal electrode 30. The floating metal ring 31 does not extend over any portion of the N− type base layer at the surface 25, nor does it extend over any portion of the annular N+ type emitter region 28 at the surface 25. The floating metal ring 31 is only in contact with the P type base region 27. In addition, the BOD device 20 includes two concentric P+ type guard rings 32 and 33. P+ type guard ring 32 surrounds the P type base region 27, and P+ type guard ring 33 surrounds the P+ type guard ring 32. In addition, the BOD device 20 includes an N+ type channel stopper ring 34.

FIG. 8 is a side view of a packaged BOD device 40. A BOD die of the type illustrated in FIG. 7 is enclosed in the plastic housing portion 41 the package of FIG. 40. The anode metal electrode 21 of the die is coupled to metal package terminal PT2 42. The cathode metal electrode 30 of the die is coupled to metal package terminal PT1 43.

FIG. 9 is a schematic diagram of the packaged BOD device 40 of FIG. 8. The connections 44 and 45 are internal to the package.

Figure 10:
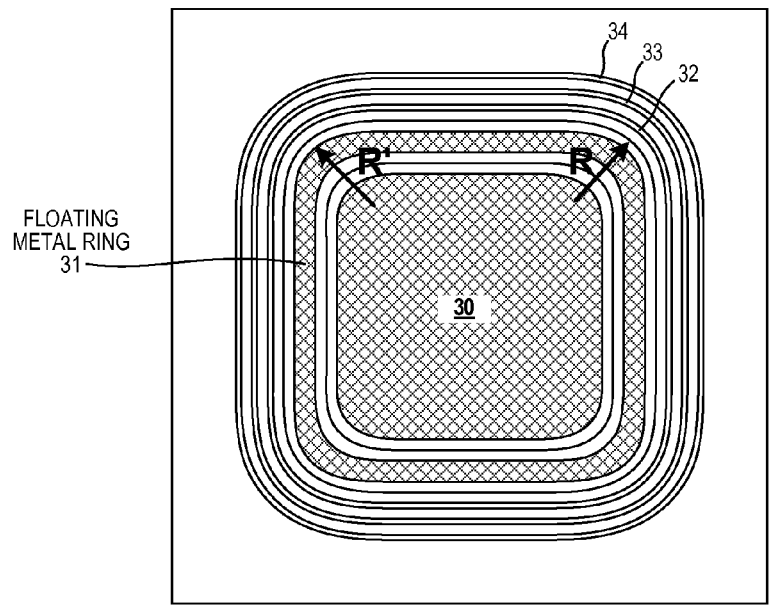
FIG. 10 is a top-down diagram of the BOD die of FIG. 7.

FIG. 10 is a diagram of the top surface of BOD die 20. The cathode metal electrode 30 has a square shape when viewed from the top-down perspective, except that the corners of the square are rounded. The peripheral edge of the P type base region 27 (when viewed from the top-down perspective) has a minimum radius of curvature of radius R. Similarly, the minimum radius of curvature R' of the floating metal ring 31 is approximately R. From the top-down perspective, the strip-like shape of the floating metal ring 31 follows along the peripheral boundary of the P type base region 27.

Figure 11:
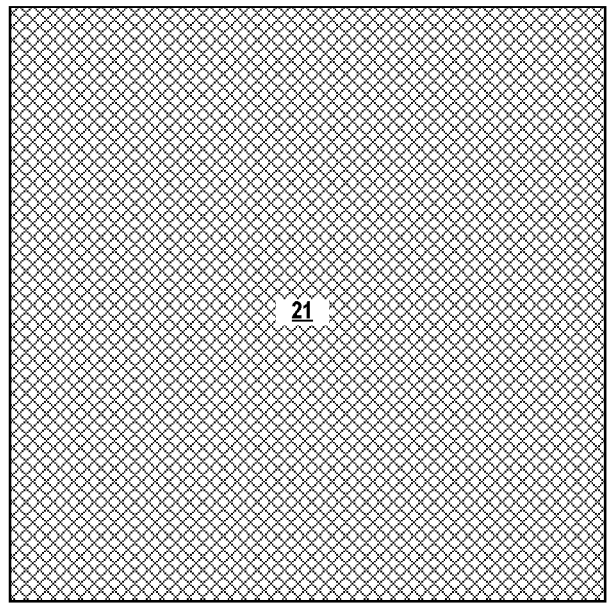
FIG. 11 is a view of the bottom of the BOD die of FIG. 7.

FIG. 11 is a diagram of the bottom surface of BOD die 20. Substantially the entire bottom surface of the BOD die is covered in metal of the anode metal electrode 21.

Figure 12:
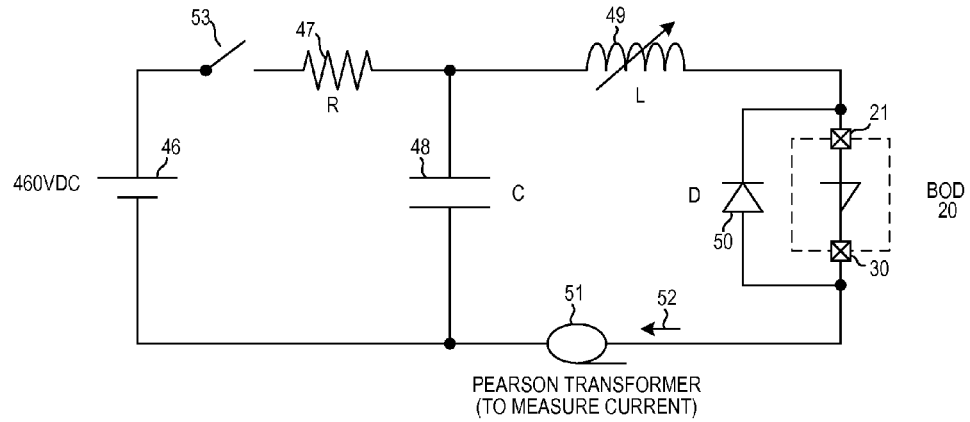
FIG. 12 is a circuit diagram of a test circuits used to exercise the BOD die of FIG. 7.

FIG. 12 is a schematic diagram of a test circuit. The high voltage DC supply 46 is isolated from the BOD device 20 by 5 k ohm resistor 47, capacitor 48, and inductor 49. The values are capacitor 48 and inductor 49 are selected depending on the pulse width and peak current desired. A 1800V antiparallel diode 50 is disposed in parallel with BOD device 20 in order to protect the BOD device 20 from any large negative transient voltages that might occur as a consequence of the switching. If a negative transient voltage where to develop across the BOD device 20, then diode 50 would conduct and limit the magnitude of this negative voltage across the BOD device. A Pearson transformer 51 is provided to detect and measure current 52 that might be flowing. In operation, the switch 53 is closed so that the DC voltage charges the capacitor 48 through the resistor 47. The voltage on capacitor 48 increases until the $V_{(BO)F}$ of the BOD device 20 is reached. The BOD device 20 is then triggered on, and current 52 begins to flow. This current 52 is measured via the Pearson transformer 51. Due to the current flow 52, the capacitor 48 is discharged through the inductance of inductor 49.

Figure 13:
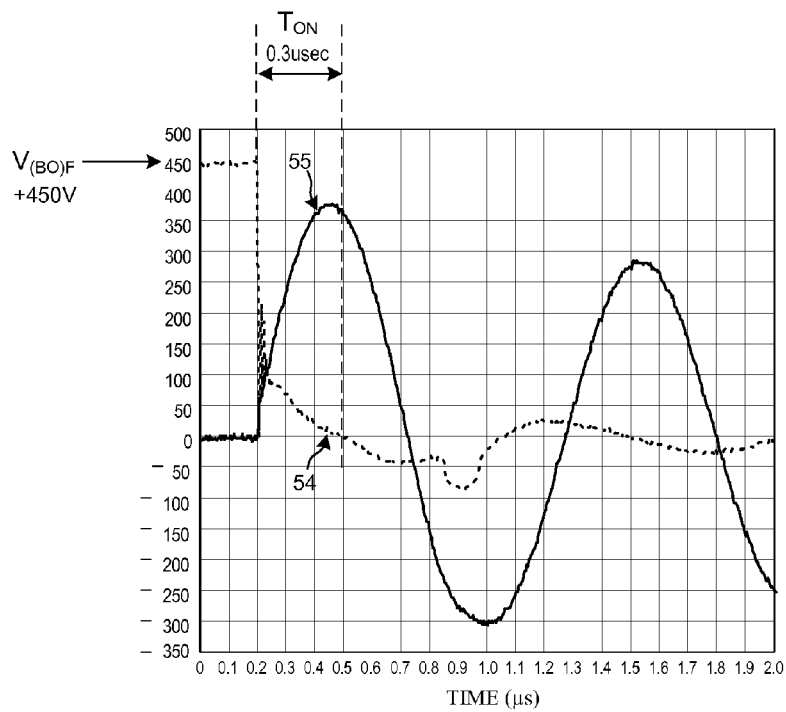
FIG. 13 is a waveform diagram that shows the turn on time TON of the BOD die of FIG. 7.

FIG. 13 is a waveform diagram showing the voltage across the BOD device 20 and the current flow 52 through the BOD device 20. The BOD device 20 of FIG. 7 has a reverse breakdown voltage of −20 volts. The dashed line 54 in FIG. 13 represents the voltage across the BOD device 20. Solid line 55 shows the current 52 flowing through the BOD device 20. The voltage across the BOD device 20 increases until the avalanche current reaches the internal triggering current of the BOD device 20, at which time the voltage across the BOD device 20 is $V_{(BO)F}$ at time 0.2 microseconds. The BOD device 20 then undergoes breakover, and current flow through the BOD device 20 rises quickly. Accordingly, the voltage across the BOD device 20 decreases quickly. The voltage across the BOD device 20 reaches zero volts by time 0.5 microseconds. The turn on time $T_{ON}$ is the time from the time when the avalanche current reaches the triggering current until the time when the voltage across the BOD device has decreased to zero volts. The turn on time $T_{ON}$ is therefore 0.3 microseconds. The subsequent part of the voltage and current waveforms involve ringing and transients that are not important for the considerations here. As compared to the 0.5 microsecond turn on time $T_{ON}$ of the prior art BOD device of FIG. 4, the 0.3 microsecond turn on time $T_{ON}$ of the BOD device of FIG. 7 is considerably smaller.

Figure 4:
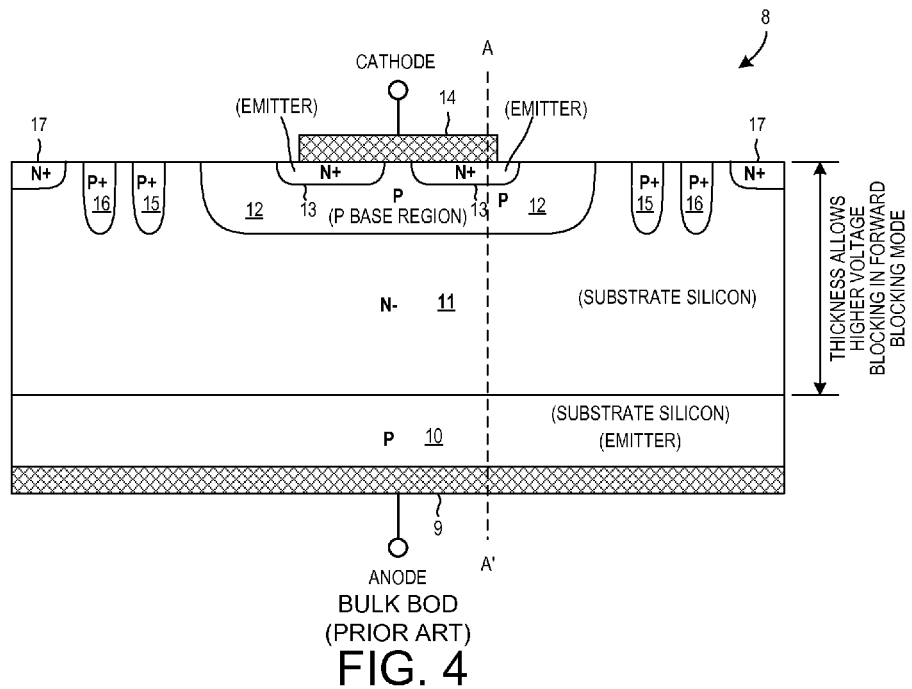
FIG. 4 (Prior Art) is a cross-sectional diagram of a bulk breakover diode device.

In one advantageous aspect, the BOD device 20 of FIG. 7 has a reduced turn on time $T_{ON}$. This is accomplished by recognizing that the delay in turn on in the prior art structure of FIG. 4 is mainly due to slow diffusion of charge carriers through the neutral part of the N− type layer 11. When avalanche occurs at the PN junction between P base region 12 and N− type layer 11, time is required for the charge carriers to pass through the structure and to reach the electrodes. In the novel BOD device 20 of FIG. 7, the thickness of the N− base layer 24 is reduced to be less than 130 microns, as compared to the thicker N− type layer 11 of the prior art structure of FIG. 4. This reduces the distance the charge carriers have to traverse in a turn on event. The forward blocking voltage of the BOD device, however, is limited by the onset of punch-through. If, under a reverse bias situation, the depletion region at the PN junction between the P type base 12 and the N− type material of layer 11 were to expand so far that it were to reach the top of the P type layer 10, then punch through would occur. At this point the device would breakdown. Accordingly, in the conventional design of FIG. 4 the N− type layer 11 is made thick enough so that under the high voltage forward voltages that the BOD device is to be able to withstand, the depletion region does not reach the P type layer 10. In the novel device of FIG. 7, on the other hand, the N− type layer 24 is made thinner and punch through is prevented by providing an extra more heavily doped N type buffer layer 23. Due to the low doping concentration in the N− type layer 24, the depletion region grows relative quickly through this layer as the forward voltage across the BOD device increases, but when the depletion region reaches the more highly doped N type buffer layer 23 the depletion region expands downward much more slowly with further increases in the forward voltage. The doping concentration of the N type buffer layer 23 is chosen to be high enough that the depletion layer is effectively stopped and does not penetrate deeper than ten microns in the N type buffer layer 23 at the time the breakover voltage is reached. This defines the lower limit for the N type dopant concentration in the buffer layer to be approximately $1\times10^{15}$ atoms/cm$^3$. On the other hand, too high an N type dopant concentration in the buffer layer would reduce the injection efficiency of the P type emitter of the PNP transistor. The P type substrate layer 22 is the emitter of this PNP transistor. If the injection efficiency of the emitter of the PNP transistor is reduced, then the turn on speed will be reduced. This defines the upper limit for the N type dopant concentration in the N type buffer layer 23 to be approximately $1\times10^{17}$ atoms/cm$^3$. The preferred range for N type dopants in the N type buffer layer 23 is $1\times10^{15}$ atoms/cm$^3$ to $1\times10^{16}$ atoms/cm$^3$. The thickness of the N type buffer layer 23 should be as small as possible, while still preventing the depletion region from penetrating through the N type buffer layer. This results in a thickness of the N type buffer layer 23 of approximately 15 microns to 25 microns.

Figure 5:
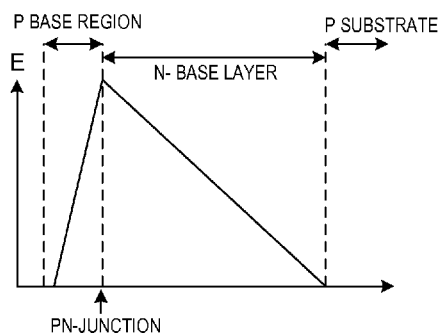
FIG. 5 (Prior Art) is a diagram that illustrates the electric field along sectional line A-A' in FIG. 4.
Figure 6:
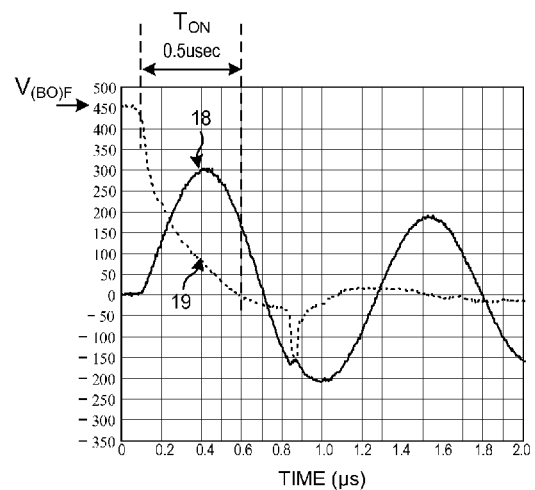
FIG. 6 (Prior Art) is a waveform diagram that shows the turn on time $T_{ON}$ of the bulk BOD device of FIG. 4.
Figure 14:
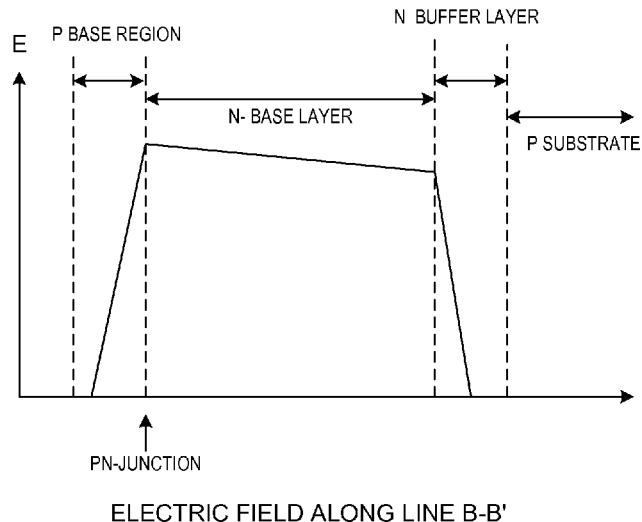
FIG. 14 is a diagram that illustrates the electric field along sectional line B-B' in FIG. 7.

FIG. 14 is a diagram that shows the strength of the electric field along sectional line B-B' in the structure of FIG. 7. The highest electric field strength is at the PN junction between the P type base region 27 and the N− type base layer 24. From this high electric field strength, the electric field decreases at a relatively lower rate (as compared to the rate of decrease of the electric field in FIG. 5) through the lightly doped N− type base layer 24. The depletion layer extends all the way through the N− type base layer 24, and into the more highly doped N type buffer layer 23. Accordingly, the magnitude of the electric field decreases at a relatively higher rate into the N− type buffer layer 24. The depletion region ends about half way into the N type buffer layer 23, well before the P type substrate is reached.

Figure 15:
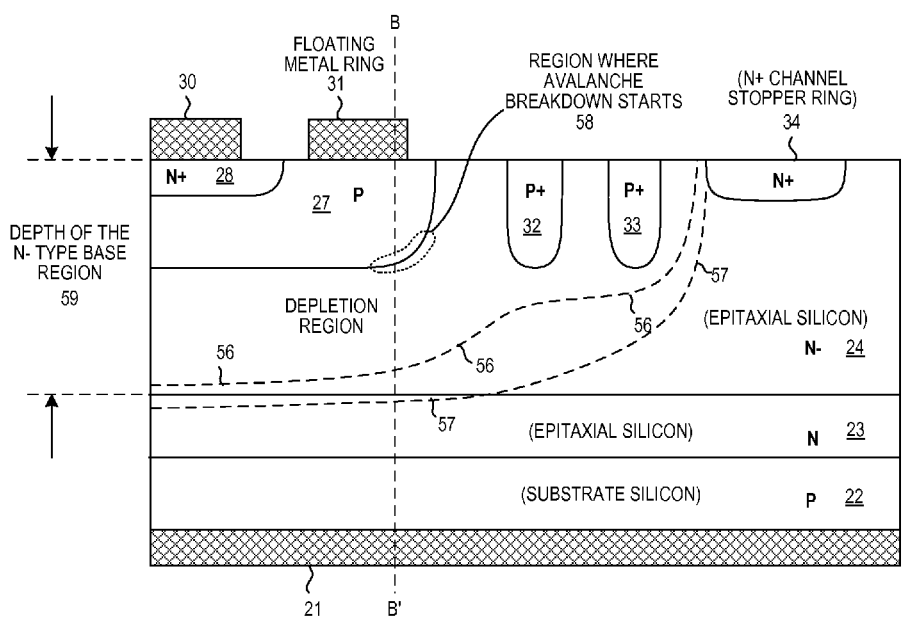
FIG. 15 is a diagram that illustrates a depletion region in the BOD die of FIG. 7 just before avalanche breakdown.

FIG. 15 is a cross-sectional diagram that shows the contour of the outer extent of the depletion region. In the diagram, as the forward voltage across the BOD device increases, the depletion region expands from the JN junction (the PN junction between P type region 17 and N− base layer 24) downward and to the right. Dashed line 56 indicates the outer extent of the depletion region at a point in time before avalanche breakdown occurs. Dashed line 57 indicates the outer extent of the depletion region at a later point in time when there is a greater forward voltage across the BOD device. The depletion region has extended into the upper part of the N type buffer layer 23. The P+ type guard rings affect and shape the contour of the boundary of the depletion region so that it has a relatively smooth shape when considered in three-dimensional space. The N+ type channel stopper ring 34 stops the depletion region from extending laterally out to the side walls of the die.

The maximum possible electric field occurs at the PN junction, at the point of highest curvature in the junction. This region is indicated in FIG. 15 by reference numeral 58. In the case of the BOD device 20 that has a very short turn on time TON of 0.3 microseconds, the triggering on of the device due to avalanche breakdown has to occur quickly, and there is not adequate time for the current conducting area of breakdown to spread over the whole emitter area. Current flow is restricted to a small area around the point where avalanche breakdown was triggered. In a conventional design, such triggering would occur at four points in the bottom corners of the P type base region. The P type base region conventionally has corners when considered from the top-down perspective, and the bottom corners are the corner PN junction at the bottom of the P type base region in these four corner areas. In accordance with one novel aspect, the turn on time $T_{ON}$ of the BOD device 20 is small in part due to increasing the minimum radius of curvature R (see FIG. 10) of the P type base region. The minimum radius of curvature R is the radius of curvature illustrated in FIG. 10. In one example, the minimum radius of curvature R is at least twice the depth D 59 of the N− type base layer 24, and is preferably four times the depth D of the N− type base layer 24. The region 58 where avalanche is triggered is therefore closer to a ring than it is to four separate points as in the prior art.

Floating metal ring 31 also facilitates uniform triggering of avalanche breakdown. Empirically it has been found that providing the floating metal ring 31 reduces $T_{ON}$. Floating metal ring 31 is thought to assist in the making the onset of avalanche more uniform due to equalizing of what might otherwise be local peaks in the electric field in the semiconductor material below the ring.

In addition to facilitating fast turn on by reducing carrier lifetime in the N− type base layer, and in addition to facilitating fast turn on by promoting uniform and distributed avalanche triggering, fast turn on is further facilitated by reducing the amount of avalanche current that causes the NPN transistor to turn on. If charge carriers are generated in region 58 in FIG. 15, then holes will move from this region laterally to the left through the P type base region 27, passing under the N+ annular emitter region 28, and to the cathode short region 29, and up to the cathode metal electrode 30. Reducing the width of the cathode short region 29, which may result in an increase in the resistance of the current path at this point, is seen to reduce the triggering current required to achieve the requisite 0.7 volt drop to turn on the NPN transistor. In one example, the width of the cathode short region is 0.125 millimeters, and the amount of avalanche current required to achieve turn on (the triggering current) is about 10 milliamperes, and the turn on time is 0.3 microseconds or less.

Figure 16:
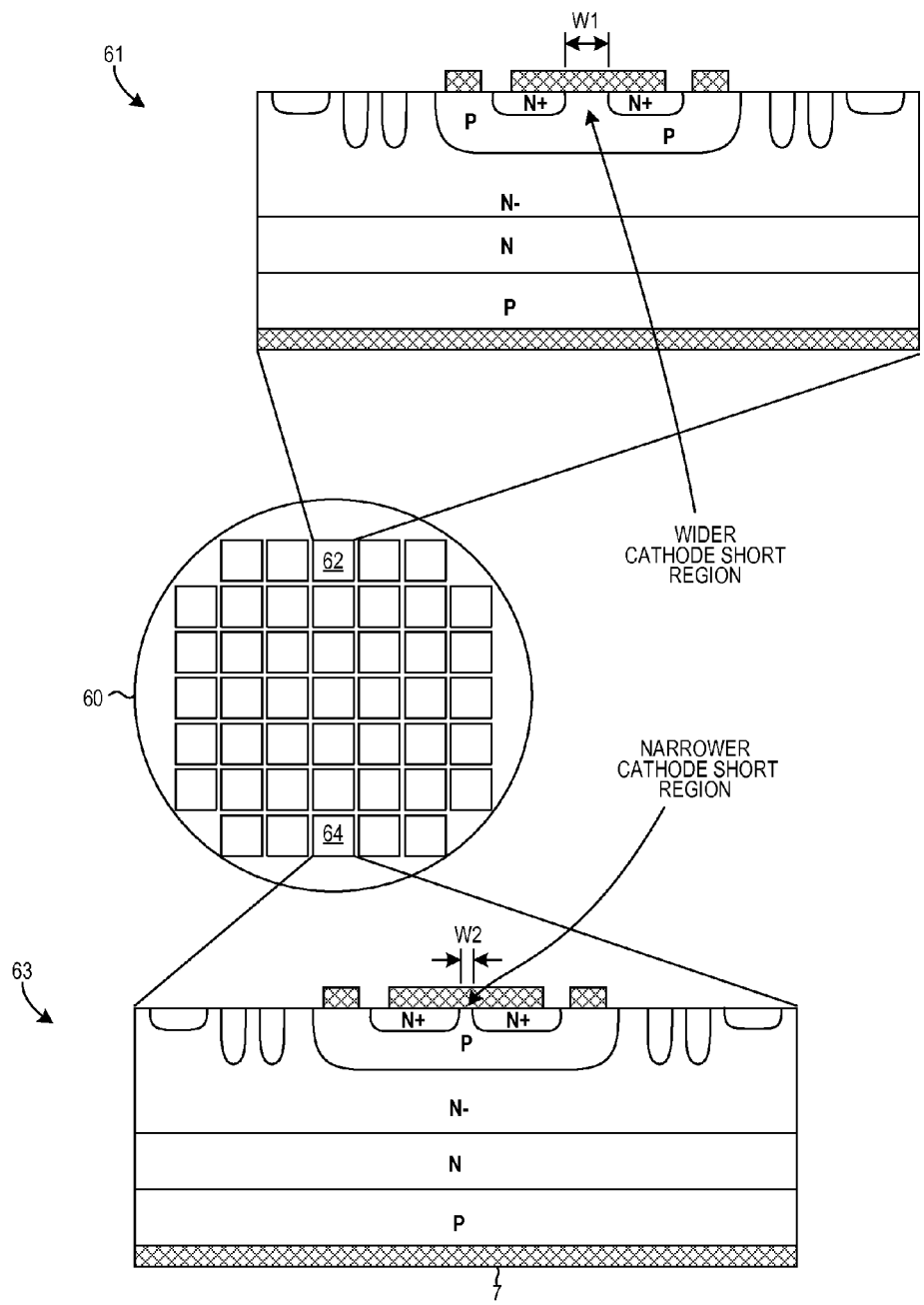
FIG. 16 is a diagram that shows BOD devices having different turn on times being manufactured as parts of the same wafer.

FIG. 16 is a diagram of a wafer 60 of BOD devices being manufactured, where different ones of the BOD devices are fabricated to have different triggering currents due to the BOD devices having different cathode short region widths. The BOD devices at this point in the semiconductor manufacturing process before wafer dicing are oriented in row and columns on the wafer. The upper part 61 of the diagram of FIG. 16 is a blowup cross-sectional view of a first BOD device 62. The lower part 63 of the diagram of FIG. 16 is a blowup cross-sectional view of a second BOD device 64. The width W1 of the cathode short region of BOD device 62 is wider than is the width W2 of the cathode short region of BOD device 64. In this way, a single wafer can yield BOD devices having a range of triggering currents.

In addition to the novel BOD device 20 of FIG. 7 having a small turn on time, and a small triggering current, the design of the BOD device 20 also results in reduced variability of the forward breakover voltage over temperature, and over process. Conventionally, variation in the forward breakover voltages of BOD devices (that ideally should have the same breakover voltage) over temperature is two percent per ten degrees Celsius, or more. Moreover, one BOD device manufactured using a design and process may have a forward breakover voltage that varies considerably from the forward breakover voltage of another BOD device manufactured on the same wafer using the same design and process. This variation in the forward breakover voltage is undesirable.

Figure 17:
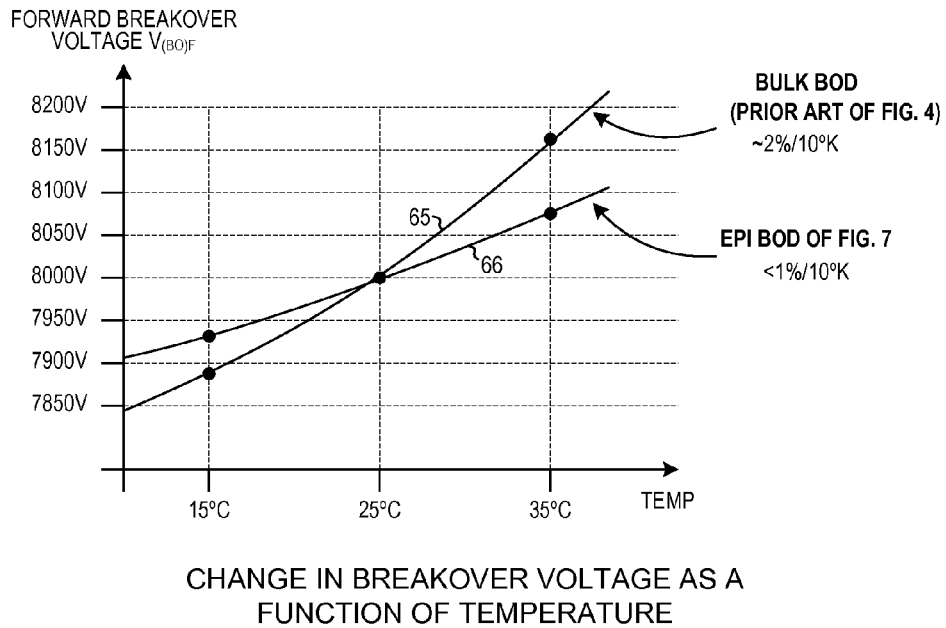
FIG. 17 is a diagram showing how the forward breakover voltage of the BOD die of FIG. 7 varies less than one percent per ten degree Celsius change in temperature.

FIG. 17 is a simplified diagram that illustrates BOD forward breakover voltage versus temperature. Line 65 shows how the forward breakover voltage of the prior art BOD diode of FIG. 4 changes at about two percent per ten degree Celsius change in temperature. Line 66 shows how the forward breakover voltage of the novel BOD diode 20 of FIG. 7 changes with temperature. Advantageously, the forward breakover voltage changes less than one percent per ten degree Celsius change in temperature.

In a conventional BOD device where the N− type layer 11 is thick, and where the depletion region expands downward a greater distance, the shape of the bottom extent of the depletion region is not perfectly planar. Variations in the doping concentration of the N− type layer 11 affect the breakover voltage, and variations of ten percent in dopant concentrations is typical. In the novel BOD device 20 of FIG. 7, on the other hand, the entire N− type layer 24 typically depletes prior to breakover. The bottom surface of N− type layer 24 is quite planar. Further expansion of the depletion region extends into the top of the N type buffer layer 23, but this buffer layer has a much higher N type dopant concentration so the depletion region does not extend far into the buffer layer. The bottom extent of the depletion region is therefore quite planar and uniform. As compared to difficulties in controlling the N type dopant concentration in the N type layer 11 of the prior art structure, it is easier to control the thickness of the N− type base layer 24 in the BOD device of FIG. 7. Due to the improved uniformity and repeatability in the way the depletion region grows in devices made using the structure of FIG. 7, the forward breakover voltages of devices made using the structure of FIG. 7 are more uniform and repeatable. The forward breakover voltage of a particular BOD device is less affected by changes in temperature as shown in the diagram of FIG. 17.

Figure 18:
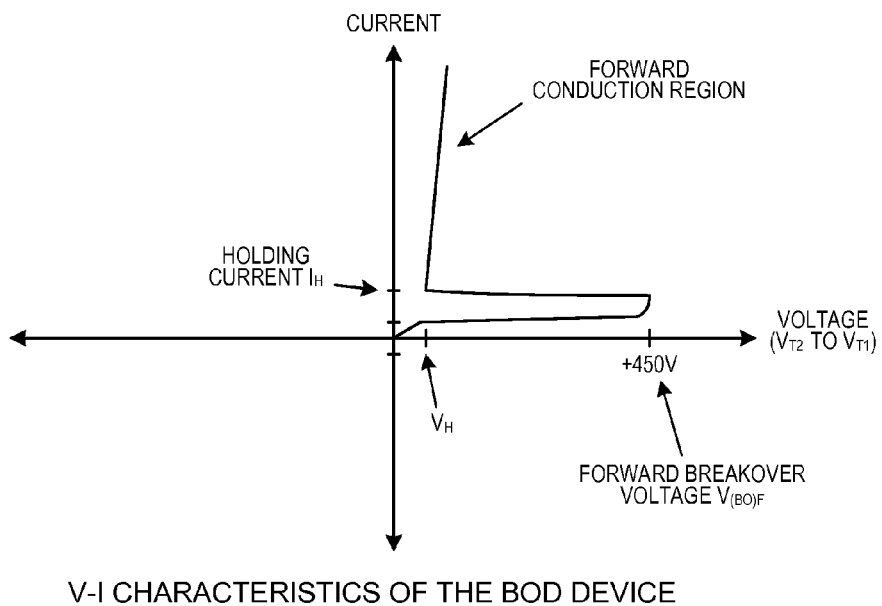
FIG. 18 is a diagram showing the V-I characteristic of the BOD die of FIG. 7.

FIG. 18 is a diagram that shows the V-I characteristic of the BOD device 20 of FIG. 17. In a simplified explanation, as the forward voltage (the voltage from terminal T2 to terminal T1) increases, the current remains very close to zero and the BOD device is in the forward blocking mode. At some high forward voltage, avalanche breakdown begins to occur, but the current flow is not equal to the triggering current. When the voltage reaches the forward breakover voltage $V_{(BO)F}$, then the avalanche current reaches the triggering current, and then breakover occurs and the BOD device turns on. The voltage across the BOD device therefore quickly falls to a low voltage $V_H$. Once the BOD device is on, an increase in the voltage across the BOD device results in a rapid increase in current. The BOD device is effectively a short. The BOD device will remain in this forward conductive mode unless the current flow through the BOD device falls below the holding current $I_H$. The BOD device is not able to tolerate reverse voltages well, so there is no voltage to current relationship shown for negative voltages.

FIG. 19 is a diagram of an overvoltage protection circuit. Two such circuits may be provided in antiparallel fashion as a crowbar to protect a piece of equipment (not shown) from voltages more positive than +2000V and from voltages more negative than −2000V. With respect to the +2000V protection circuit, if the positive voltage between node 67 and node 68 grows adequately large, then the large positive voltage will effectively be present across packaged BOD device 40. When the voltage reaches the forward breakover voltage of the BOD device, the BOD device breaks over and turns on. The resulting current, which is limited by resistor 70, then flows from node 67, through the resistor 70, through a reverse diode 71, through the packaged BOD device 40, and into the gate terminal G of the thyristor 69. This gate current triggers the thyristor 69 on. As a result of the triggering current flowing into the gate of thyristor 69, thyristor 69 turns on and conducts a large amount of current from node 67 to node 68, thereby reducing the voltage between nodes 67 and 68, and thereby protecting the equipment from overvoltage. The BOD device cannot tolerate large negative voltages (for example, cannot tolerate a negative voltage greater than −20V), so the reverse diode 71 is provided to block current from flowing upward through the BOD device from terminal PT1 to PT2 during large negative voltage situations. In addition, the thyristor can turn off rapidly. When the thyristor turns off it can generate voltage spikes (voltage spikes between the thyristor cathode and the thyristor gate). The RC circuit of resistor 72 and capacitor 73 is a snubber circuit. The snubber circuit is provided to soften the effect of the self-induced voltage spikes, and prevents these self-induced spikes from reaching and damaging the BOD device. As just described, the circuit pictured in FIG. 19 protects the equipment against positive voltages in excess of +2000V. There is also a similar circuit (not shown) provided in the opposite direction between the same two nodes 67 and 68 to protect the equipment from voltages that are more negative than −2000V.

The variation in the forward breakover voltage as a function of temperature changes is a major problem because margin needs to be provided in the capability of the other parts of the circuit (such as the thyristor), and in the equipment being protected, to account for the changes in the breakover voltage of the BOD device. When temperature increases, the equipment and thyristor still need to be able to tolerate the higher voltage that may be present (due to the breakover voltage of the BOD device increasing). The less than one percent change in forward breakover voltage per ten degrees Celsius (see line 66 of FIG. 17) can result in major cost savings in the overall system as compared to the two percent change in forward breakover voltage per ten degrees Celsius of the prior art bulk BOD of FIG. 4.

FIG. 20 is a table that shows various aspects of the composition of the BOD device of FIG. 7.

FIG. 21 is a table that shows how reducing the cathode short region width results in reduced triggering currents.

FIG. 22 is a cross-sectional diagram of a BOD device 100 having comparable forward breakover and reverse breakdown voltages in accordance with one novel aspect. BOD device 100 has a forward breakover voltage of +450 volts and a reverse breakdown voltage of −500 volts. The voltages are comparable in the sense that the absolute magnitude of the reverse breakdown voltage is slightly greater than the forward breakover voltage. A metal anode electrode 101 is disposed on the bottom surface of a layer of P type substrate semiconductor material 102. An N− type base layer 103 of substrate semiconductor material is disposed on the P type substrate layer 102. The N− type base layer can be formed by diffusing N type dopants down into the P type substrate material from the upper semiconductor surface. The N− type base layer 103 extends up to an upper semiconductor surface 104 of the die structure. The bottom semiconductor surface of the die structure is identified by reference numeral 105. In the illustrated example, the two surfaces 104 and 105 are substantially planar.

A P type base region 106 extends down into the N− base layer 103 from the upper semiconductor surface 104. An N+ type annular emitter region 107 extends down into the P type base region 106 from the upper semiconductor surface 104 as shown. Region 107 is annular in that it has a ring-shape when considered from the top-down perspective. An amount of the P type material of the P type base region 106 in the center of the ring extends up so that the P type material reaches the upper semiconductor surface 104. This amount of P type material is referred to as the cathode short region 108. A metal cathode electrode 109 is disposed on the upper semiconductor surface 104 so that it makes contact with the N+ type annular emitter region 107 and with the cathode short region 108 at the upper semiconductor surface 104 as shown. An optional floating metal ring 110 is disposed on the upper surface of the P type base region 106 so that the floating metal ring 110 surrounds, but does not touch, the metal cathode electrode 109. This structure of the upper portion of the BOD of FIG. 22 is similar to the structure of the upper portion of the BOD of FIG. 7, except that in the case of the BOD of FIG. 22 a peripheral P type isolation diffusion region 111 is provided. The peripheral P type isolation diffusion region 111 extends from the upper semiconductor surface 104 all the way through the die structure to the bottom semiconductor surface 105. The peripheral P type isolation diffusion region reaches the side edges of the die as shown. The peripheral P type isolation diffusion region is formed by implanting and diffusing P type dopants into the structure from the upper semiconductor surface 104, and by implanting and diffusing P type dopants into the structure from the bottom semiconductor surface 105, so that the two doped regions meet. As in the case of the BOD of FIG. 7, two P+ type guard rings 112 and 113 are provided and an N+ type channel stopper 114 is provided as well.

FIG. 23 is a side view of a packaged BOD device 115. A BOD die of the type illustrated in FIG. 22 is enclosed in the plastic housing portion 116 of the package of FIG. 23. The anode metal electrode 101 of the BOD die is coupled to metal package terminal PT2 117. The cathode metal electrode 109 of the BOD die is coupled to metal package terminal PT1 118.

FIG. 24 is a schematic diagram of the packaged BOD device 115 of FIG. 23. The connections 119 and 120 are internal to the package. The BOD device is a N-P-N-P layered device, where the top N type layer is the N+ type annular emitter region, where the next P type layer is the P type base region 106, where the next N type layer is the N− type base layer 103, and where the last P type layer is the P type substrate layer 102. The BOD die 100 does not actually include a reverse diode separate from the BOD diode, but rather the symbols of FIG. 24 indicate a functionality of the device. The reverse diode function is performed by the PN junction of the J1 junction between P type substrate 102 and N− type base layer 103.

Figure 25:
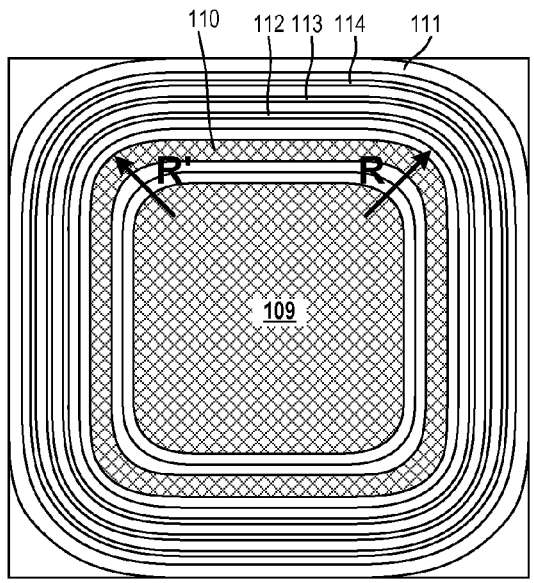
FIG. 25 is a top-down diagram of the BOD device of FIG. 22.

FIG. 25 is a top-down diagram of the BOD die 100 of FIG. 22. As in the case of the BOD die of FIG. 10 described above, the periphery of P type base region 106 (when considered from the top-down perspective) has a minimum radius of curvature R, where R is at least twice the depth D of the N− type base layer 103, and is preferably four times the depth D of the N− type base layer 103.

Figure 26:
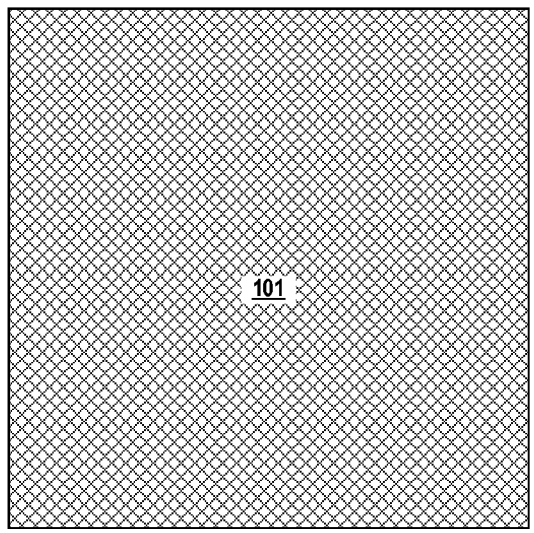
FIG. 26 is a diagram of the bottom of the BOD device of FIG. 22.

FIG. 26 is a diagram of the bottom surface of the BOD die 100 of FIG. 22. Substantially the entire bottom surface of the BOD die is covered in metal of the metal anode electrode 101.

Figure 27:
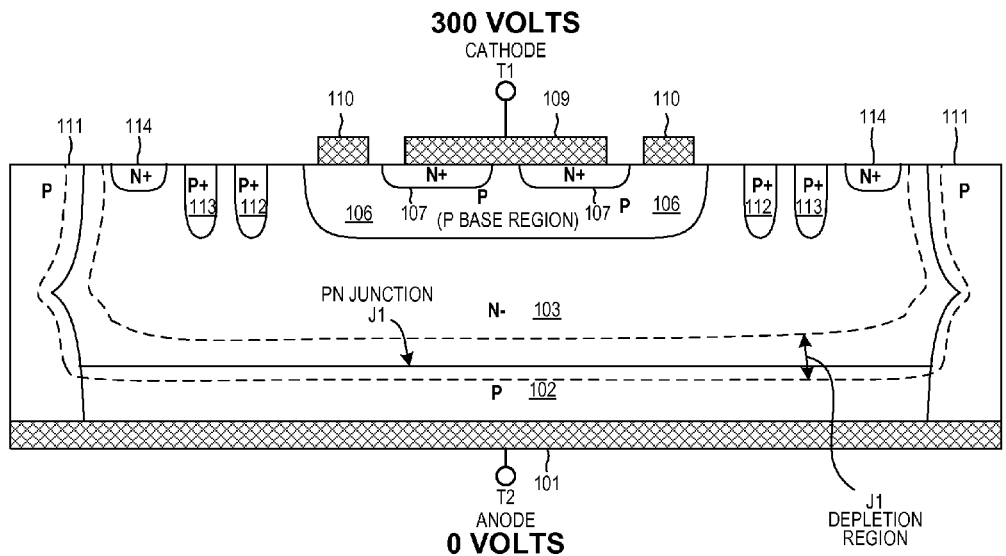
FIG. 27 is a cross-sectional diagram of the BOD device of FIG. 22 showing the J1 depletion region for a reverse voltage of about −300 volts.

FIG. 27 is a cross-sectional diagram of the BOD device 100 under a reverse voltage of −300 volts (the anode is −300 volts with respect to the cathode). The BOD device 100 successfully blocks this −300 volt reverse voltage. The depletion region extends from the J1 PN junction into the N− base layer 103. The depletion region also extends from the J1 PN junction into the P type substrate layer 102 and into the P type isolation diffusion region 111. Whereas the reverse breakdown voltage of the BOD device of FIG. 19 is about −200 volts, the reverse breakdown voltage of the BOD device of FIG. 22 is about −500 volts. The absolute magnitude of the reverse breakdown voltage (−500 volts) is higher than the forward breakover voltage (+450 volts) because in the forward bias direction the base region 106 has a cylindrical junction. In the forward bias direction, without the guard rings, the device would break down at about +100 volts. By adding the guard rings the breakdown voltage (−450 volts) in the forward bias direction is increased to about 85% of the breakdown voltage of the bulk silicon. In the reverse direction, there is no cylindrical junction. The absolute magnitude of the reverse breakdown voltage of the BOD device (−500 volts) is approximately the same as the bulk breakdown voltage of bulk silicon. Without the P type isolation region, the reverse breakdown voltage would be approximately −50 volts to −100 volts.

Figure 28:
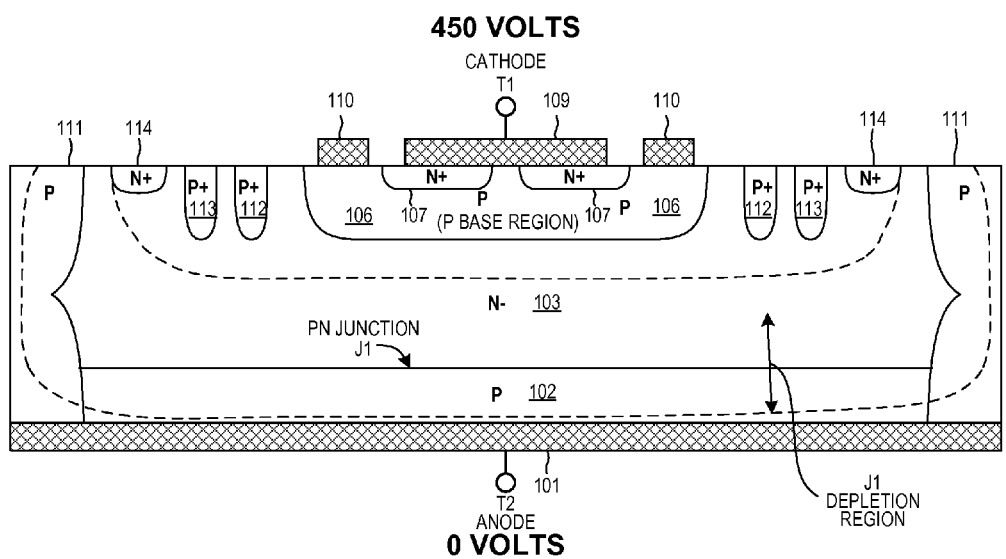
FIG. 28 is cross-sectional diagram of the BOD device of FIG. 22 showing the J1 depletion region for a reverse voltage of about −500 volts.

FIG. 28 is a cross-sectional diagram of the BOD device 100 under a reverse voltage of −450 volts. The BOD device 100 successfully blocks the −450 volt reverse voltage. The depletion region extends from the J1 PN junction farther into the N− base layer 103 and farther into the P type substrate layer 102 and the P type isolation diffusion region 111.

Figure 29:
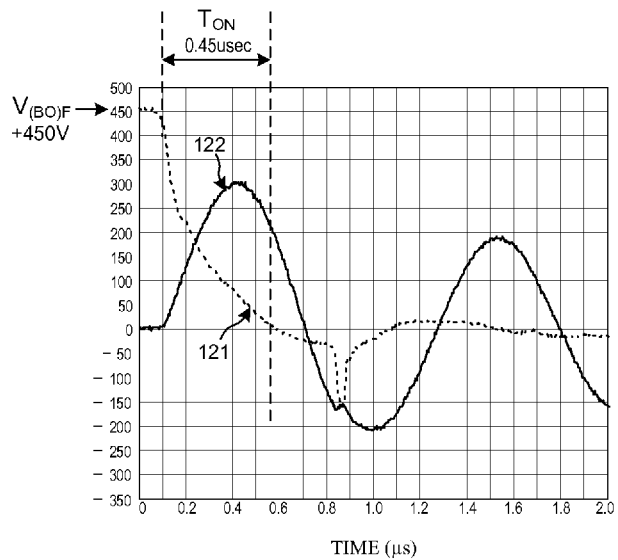
FIG. 29 is a diagram that shows the turn on time TON of the BOD device of FIG. 22, when the BOD device is tested in the test circuit of FIG. 12.

FIG. 29 is a waveform diagram showing the voltage across packaged BOD device 115 of FIG. 23 when the BOD device is put into the test circuit of FIG. 12. The BOD device 115 of FIG. 23 has a reverse breakdown voltage of about −500 volts. The dashed line 121 in FIG. 29 shows the voltage across the BOD device in a test. Solid line 122 shows the current flowing through the BOD device. Avalanche current increases, until the magnitude of the avalanche current reaches the triggering current at the +450 volt forward breakover voltage $V_{(BO)F}$. The forward breakover voltage $V_{(BO)F}$ is reached at 0.1 microseconds. The breakover diode then breaks over, and begins to conduct current. The voltage across the BOD device drops, and the current increases. The voltage across the BOD device reaches zero at time 0.55 microseconds. The turn on time $T_{ON}$ is the time from when the avalanche current reaches the triggering current until the time when the voltage across the BOD device has decreased to zero. The turn on time $T_{ON}$ is therefore 0.45 microseconds.

Figure 30:
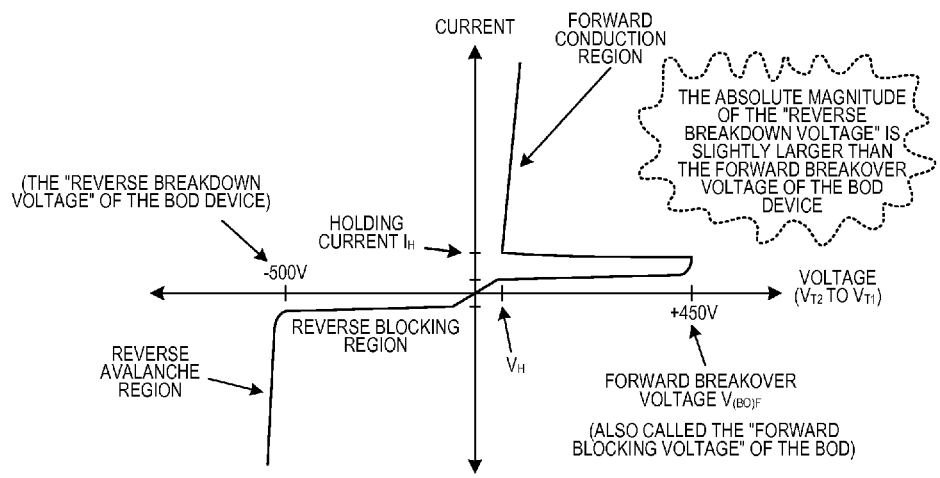
FIG. 30 is a diagram that shows the V-I characteristic of the BOD device of FIG. 22.

FIG. 30 is a diagram that shows the V-I characteristic of the BOD device of FIG. 22. In a simplified explanation, as the forward voltage (the voltage from terminal T2 to terminal T1) increases, the current remains very close to zero and the BOD device is in the forward blocking mode. When the voltage reaches the forward breakover voltage $V_{(BO)F}$ of +450 volts, then breakover occurs and the BOD device turns on. The voltage across the BOD device therefore falls quickly to a low voltage $V_H$. Once the BOD device is on, an increase in the voltage across the BOD device results in a rapid increase in current. The BOD device is effectively a short. The BOD device will remain in this forward conductive mode unless the current flow through the BOD device falls below the holding current $I_H$.

Unlike the BOD device of FIG. 7, the BOD device of FIG. 22 is able to tolerate reverse voltages up to −500 volts. If the reverse voltage exceeds this −500 volt value, then the BOD device undergoes breakdown and a reverse current flows. This is the "reverse avalanche region" labeled on the diagram. The reverse breakdown voltage (also sometimes called the "reverse breakover voltage") of the BOD device is −500 volts, which is slightly larger in absolute magnitude than the +450 volt forward breakover voltage. Using the architecture of the BOD device of FIG. 22, the reverse breakdown voltage is made to be a little larger in absolute magnitude than the forward breakover voltage, and the forward breakover voltage can be made to be anywhere in a range from +200V to greater than +900V.

FIG. 31 is a table that shows the composition of the various parts of the BOD device of FIG. 22. In this example, as indicated in the graph of FIG. 30, the BOD device 100 of FIG. 22 has a forward breakover voltage of +450 volts, and a reverse breakdown voltage of −500 volts.

FIG. 32 is a side view of a packaged overvoltage protection circuit 123 in accordance with another embodiment. The packaged device 123 includes a housing portion 124, a PT2 package terminal 125, and a PT1 package terminal 126. A plurality of BOD dice of the type illustrated in FIG. 22, along with other components, are enclosed in the housing portion 124.

Figure 33:
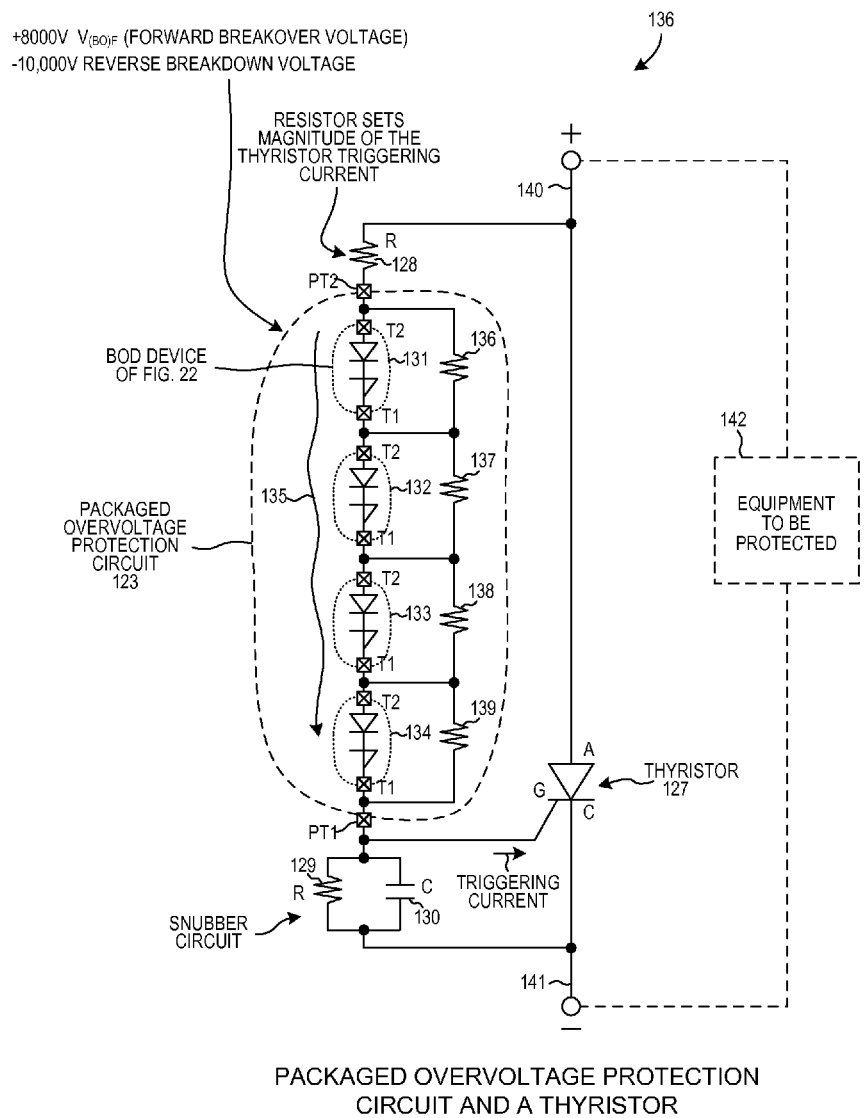
FIG. 33 is a circuit diagram of the packaged overvoltage protection circuit of FIG. 32 in use with a thyristor, a current limiting resistor, and a snubber.

FIG. 33 is a circuit diagram of an apparatus and circuit 136. Apparatus and circuit 136 involves the packaged device 123 of FIG. 32 in use in combination with a thyristor 127. The apparatus and circuit 136 includes a current limiting resistor 128, the packaged device 123, and a RC snubber circuit 129, 130. Operation of the circuit of FIG. 33 is similar to the operation of the circuit of FIG. 19 described above. The packaged overvoltage protection circuit 123 functions similar to a single BOD device that has a forward breakover voltage of +8000 volts, and a reverse breakdown voltage of −10,000 volts. The contents of the packaged device 123 is shown encircled in the dashed line 123. Within packaged device 123 there are four identical dice 131-134 of the type of FIG. 22, with these dice being coupled in series between package terminal PT2 and package terminal PT1. If the forward voltage drop between PT2 and PT1 reaches the forward breakover voltage of +8000 volts, then the BOD devices undergo breakover and a breakover current flows through the BOD devices in current path 135 from PT2 to PT1. But for a small leakage current that flows through the resistor string 136-139, the packaged device 123 blocks substantially all current flow for positive voltages between PT2 and PT1 unless the forward voltage reaches or exceeds +8000 volts. The triggering current of the BOD device may, for example, be 10 mA and this current only flows at high forward voltages approaching $V_{(BO)F}$. In the reverse direction, each of the BOD devices can withstand a reverse voltage of −500 volts before suffering breakdown. Accordingly, other than for a small leakage current that flows through the resistor string 136-139 and a small triggering current, the packaged device 123 blocks current flow for negative voltages between PT2 and PT1 unless the negative voltage reaches or exceeds −10,000 volts. The resistances of the resistors is made large so that the current flow through the resistor string is inconsequential.

In operation, if the voltage between node 140 and 141 reaches +8000 volts, then the BOD devices in packaged device 123 undergo breakover, and a current flows from PT2 to PT1 and this current is injected into the gate of thyristor 127, thereby turning on the thyristor. As a consequence of the thyristor turning on, the thyristor conducts a large current from node 140 to node 141 through the thyristor, and this large current reduces the voltage between nodes 140 and 141 to a voltage below the +8000 volts. Equipment 142 that is not to experience voltages in excess of +8000 volts is connected across the nodes 140 and 141, so that the circuit of FIG. 33 will prevent the voltage between those nodes from exceeding +8000 volts. As explained above in connection with FIG. 19, resistor 128 has a current limiting function in limiting the magnitude of the triggering current sent into the gate of the thyristor. The snubber 129, 130 protects the BOD devices from potentially harmful voltage spikes that the thyristor itself generates between the gate and cathode of the thyristor. The thyristor may generate such spikes when it turn on and/or off rapidly. Due the ability of each BOD device to block a reverse voltage of −500 volts, the circuit of FIG. 33 does not include an expensive reverse diode such as reverse diode 71 of FIG. 19. As explained above in connection with FIG. 19, there is typically another circuit identical to the circuit of FIG. 33 where this other circuit is coupled in antiparallel fashion to nodes 140 and 141. The first circuit is to stop positive voltages more positive than +8000 volts from appearing between nodes 140 and 141, whereas the second circuit is to stop negative voltages more negative than −8000 volts from appearing between nodes 140 and 141. Equipment to be protected 142 in this case is not to see voltages whose absolute magnitudes are greater than 8000 volts. Although an embodiment is shown in which a resistor is coupled in parallel with each individual BOD device, some BOD devices may not have such a parallel-connected resistor in some embodiments. Although an embodiment is shown in which all the BOD devices are identical, in another embodiments BOD devices that have different forward breakover voltages are provided in the same packaged overvoltage protection circuit to provide a desired different overall forward breakover voltage and a desired different overall reverse breakdown voltage of the overall packaged overvoltage protection circuit.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A packaged overvoltage protection circuit comprising:
a first semiconductor die, wherein the first semiconductor die comprises a breakover diode having a reverse breakdown voltage of at least four hundred volts;
a second semiconductor die, wherein the second semiconductor die comprises a breakover diode having a reverse breakdown voltage of at least four hundred volts;
a package housing that encloses the first and second semiconductor dice;
a first package terminal; and
a second package terminal, wherein the first and second semiconductor dice are coupled such that if a positive voltage of adequate magnitude is present between the second package terminal and the first package terminal then breakover of the breakover diodes in the first and second semiconductor dice occurs and a current flows in a current path from the second package terminal, through the breakover diode of the first semiconductor die, through the breakover diode of the second semiconductor die, and to the first package terminal, and such that if a negative voltage of nine hundred volts or less is present between the second package terminal and the first package terminal then neither of the breakover diodes of the first and second semiconductor dice suffers reverse breakdown, and wherein the packaged overvoltage protection circuit has no package terminal other than the first and second package terminals.

2. The packaged overvoltage protection circuit of claim 1, wherein the package housing encloses no semiconductor die that comprises any component other than a breakover diode.

3. The packaged overvoltage protection circuit of claim 1, wherein the package housing encloses no diode that is not a part of a breakover diode die.

4. The packaged overvoltage protection circuit of claim 1, further comprising:
a third semiconductor die, wherein the third semiconductor die comprises a breakover diode having a reverse breakdown voltage of at least four hundred volts.

5. The packaged overvoltage protection circuit of claim 1, further comprising:
a first resistor; and
a second resistor, wherein the first and second resistors are coupled in series.

6. The packaged overvoltage protection circuit of claim 1, further comprising:
a first resistor coupled in parallel with the first semiconductor die; and
a second resistor coupled in parallel with the second semiconductor die.

7. The packaged overvoltage protection circuit of claim 1, wherein the first and second semiconductor dice are coupled to block current flow through the current path from the first package terminal to the second package terminal for reverse voltages of nine hundred volts or less.

8. A packaged overvoltage protection circuit comprising:
a first package terminal;
a second package terminal, wherein the packaged overvoltage protection circuit has only two package terminals;
a plurality of semiconductor dice, wherein each of the semiconductor dice comprises a breakover diode, wherein the breakover diode has a forward breakover voltage, wherein the breakover diode has a reverse breakdown voltage whose absolute magnitude is greater than the forward breakover voltage, wherein the plurality of semiconductor dice are coupled in series between the first and second package terminals, and wherein the breakover voltage is at least four hundred volts;
a plurality of resistors, wherein the resistors are coupled in series; and
a package housing that encloses the plurality of semiconductor dice and the plurality of resistors, wherein the package housing encloses no semiconductor die other than said plurality of semiconductor dice.

9. The packaged overvoltage protection circuit of claim 8, wherein each of the plurality of semiconductor dice is substantially identical to each other of the plurality of semiconductor dice.

10. The packaged overvoltage protection circuit of claim 8, wherein each of the plurality of resistors is coupled in parallel with each corresponding respective one of the plurality of semiconductor dice.

11. An apparatus comprising:
a first package terminal;
a second package terminal, wherein the apparatus has no more than two package terminals; and
means for blocking substantially all current flow from the second package terminal to the first package terminal for positive voltages less than a first voltage between the second and first package terminals, for initiating conduction of a breakover current from the second package terminal to the first package terminal if a positive voltage equal to the first voltage becomes present between the second and first package terminals, and for blocking substantially all current flow from the first package terminal to the second package terminal for negative voltages less than a second voltage between the second package terminal and the first package terminal, wherein the absolute magnitude of the second voltage exceeds the first voltage, wherein the first voltage is at least nine hundred volts, wherein the means comprises no semiconductor die other than a plurality of semiconductor dice, and wherein each die of the plurality of semiconductor dice comprises a breakover diode.

12. The apparatus of claim 11, wherein the plurality of semiconductor dice are coupled together in series between the first and second package terminals.

13. The apparatus of claim 12, wherein the means further comprises a plurality of resistors coupled together in series to form a resistor string.

14. The apparatus of claim 13, wherein the means further comprises a housing that encloses the plurality of semiconductor dice and the plurality of resistors.

15. The apparatus of claim 14, wherein the means does not block current flow that passes through the resistor string.

16. The apparatus of claim 11, wherein the means is also for supplying a triggering current to the gate of a thyristor.

17. The apparatus of claim 11, further comprising:
a thyristor having a gate, an anode, and a cathode, wherein the gate of the thyristor is coupled to the first package terminal.

18. The apparatus of claim 11, further comprising:
a thyristor having a gate, an anode, and a cathode, wherein the gate of the thyristor is coupled to the first package terminal, wherein the anode of the thyristor is coupled to the second package terminal via a current limiting resistor.

19. An apparatus comprising:
a first package terminal;
a second package terminal;
means for blocking substantially all current flow from the second package terminal to the first package terminal for positive voltages less than a first voltage between the second and first package terminals, for initiating conduction of a breakover current from the second package terminal to the first package terminal if a positive voltage equal to the first voltage becomes present between the second and first package terminals, and for blocking substantially all current flow from the first package terminal to the second package terminal for negative voltages less than a second voltage between the second package terminal and the first package terminal, wherein the absolute magnitude of the second voltage exceeds the first voltage, wherein the first voltage is at least nine hundred volts, wherein the means comprises no semiconductor die other than a plurality of semiconductor dice, and wherein each die of the plurality of semiconductor dice comprises a breakover diode;
a thyristor having a gate, an anode, and a cathode, wherein the gate of the thyristor is coupled to the first package terminal; and
a snubber circuit directly coupled between the gate of the thyristor and the cathode of the thyristor.

20. A device comprising:
a packaged overvoltage protection circuit comprising:
a first semiconductor die, wherein the first semiconductor die comprises a breakover diode having a reverse breakdown voltage of at least four hundred volts;
a second semiconductor die, wherein the second semiconductor die comprises a breakover diode having a reverse breakdown voltage of at least four hundred volts;
a package housing that encloses the first and second semiconductor dice;
a first package terminal; and
a second package terminal, wherein the first and second semiconductor dice are coupled such that if a positive voltage of adequate magnitude is present between the second package terminal and the first package terminal then breakover of the breakover diodes in the first and second semiconductor dice occurs and a current flows in a current path from the second package terminal, through the breakover diode of the first semiconductor die, through the breakover diode of the second semiconductor die, and to the first package terminal, and such that if a negative voltage of nine hundred volts or less is present between the second package terminal and the first package terminal then neither of the breakover diodes of the first and second semiconductor dice suffers reverse breakdown;
a thyristor having a gate, an anode, and a cathode, wherein the gate of the thyristor is coupled to the first package terminal; and
a snubber circuit directly coupled between the gate of the thyristor and the cathode of the thyristor.

21. The device of claim 20, wherein the package housing encloses no semiconductor die that comprises any component other than a breakover diode.

22. The device of claim 20, wherein the package housing encloses no diode that is not a part of a breakover diode die.

* * * * *